(12) United States Patent
Mori et al.

(10) Patent No.: US 12,392,507 B2
(45) Date of Patent: Aug. 19, 2025

(54) OUTDOOR UNIT OF AIR CONDITIONER

(71) Applicant: Carrier Japan Corporation, Tokyo (JP)

(72) Inventors: Katsutoshi Mori, Fuji (JP); Ken Miura, Fuji (JP)

(73) Assignee: Carrier Japan Corporation, Tokyo (JP)

( * ) Notice: Subject to any disclaimer, the term of this patent is extended or adjusted under 35 U.S.C. 154(b) by 211 days.

(21) Appl. No.: 18/178,154

(22) Filed: Mar. 3, 2023

(65) Prior Publication Data
US 2023/0204232 A1 Jun. 29, 2023

Related U.S. Application Data

(63) Continuation of application No. PCT/JP2020/033679, filed on Sep. 4, 2020.

(51) Int. Cl.
*F24F 1/24* (2011.01)
*F25B 6/02* (2006.01)
(Continued)

(52) U.S. Cl.
CPC ............. *F24F 1/24* (2013.01); *F25B 6/02* (2013.01); *F25B 40/02* (2013.01);
(Continued)

(58) Field of Classification Search
CPC .. F25B 2313/0253; F25B 41/39; F25B 13/00; F24F 1/24
See application file for complete search history.

(56) References Cited

U.S. PATENT DOCUMENTS 9,784,481 B2 * 10/2017 Kawano ............... F25B 31/006
11,976,857 B2 * 5/2024 Koike .................. F25B 31/006
(Continued)

FOREIGN PATENT DOCUMENTS

EP 3056837 A1 8/2016
EP 3502592 A1 6/2019
(Continued)

OTHER PUBLICATIONS

Extended European Search Report mailed on Apr. 29, 2024 for European Patent Application No. 20952477.6, a foreign counter part of U.S. Appl. No. 18/178,154, 7 pages.
(Continued)

*Primary Examiner* — Ana M Vazquez
(74) *Attorney, Agent, or Firm* — Lee & Hayes, P.C.

(57) ABSTRACT

According to one embodiment, this outdoor unit of an air conditioner includes a compressor, a heat exchanger, an expansion valve, a blower fan, electrical components, and a heat sink. The heat exchanger includes a first group constituted of at least one of the plurality of heat exchangers and a second group constituted of at least one of the plurality of heat exchangers not belonging to the first group. The expansion valve includes a first expansion valve and a second expansion valve. The heat sink is arranged on the flow path of the refrigerant on the upstream side of a confluence position of the refrigerant branches condensed by the heat exchangers of the first group and the second group and on the downstream side of the second expansion valve.

6 Claims, 3 Drawing Sheets

(51) Int. Cl.
*F25B 40/02* (2006.01)
*H05K 7/20* (2006.01)
(52) U.S. Cl.
CPC ..... *H05K 7/20254* (2013.01); *H05K 7/20272* (2013.01); *H05K 7/20927* (2013.01)

(56) References Cited

U.S. PATENT DOCUMENTS

2016/0238285 A1  8/2016  Kawano et al.
2021/0378084 A1  12/2021  Harada et al.

FOREIGN PATENT DOCUMENTS

| JP | 2011117677 A | 6/2011 |
| JP | 2015075258 A | 4/2015 |
| WO | WO2019082783 A1 | 5/2019 |

OTHER PUBLICATIONS

The PCT Search Report and Written Opinion mailed on Oct. 13, 2020 for PCT Application No. PCT/JP2020/033679, 14 pages.

\* cited by examiner

OUTDOOR UNIT OF AIR CONDITIONER

CROSS-REFERENCE TO RELATED APPLICATIONS

This application is a Continuation Application of PCT Application No. PCT/JP2020/033679, filed Sep. 4, 2020, the entire contents of which are incorporated herein by reference.

FIELD

Embodiments described herein relate generally to an outdoor unit of an air conditioner.

BACKGROUND

In an outdoor unit of an air conditioner, a mechanism configured to cool electrical components involving heat generation and incorporated in the outdoor unit such as switching elements of an inverter, circuit board or the like on which the aforementioned elements are mounted is provided. As an example of the aforementioned cooling mechanism, a refrigerant-cooled heat sink (hereinafter simply referred to as a heat sink) configured to cool electrical components with a refrigerant is given.

The heat sink is provided on a refrigerant flow path on the downstream side of, for example, a single heat exchanger (condenser) provided in the outdoor unit or at a flow path position which is on the downstream side of a plurality of heat exchangers (condensers) connected in parallel with each other and at which refrigerant (condensed liquid refrigerant) branches outflowing from the heat exchangers join each other. At the time of a cooling operation, the cooling effect of the heat sink changes depending on the temperature and circulating volume of the liquid refrigerant condensed by the heat exchanger (condenser). For example, when the liquid refrigerant temperature is low and refrigerant circulating volume is large, the cooling effect of the heat sink becomes greater. Accordingly, the cooling effect of the heat sink in the air-cooled condenser becomes greater to such a degree that the temperature of the liquid refrigerant is lowered to the temperature of the sucked air passing through the aforementioned condenser. In order to lower the temperature of the liquid refrigerant to the temperature of the sucked air of the condenser, the degree of opening of the expansion valve provided on the downstream side of the condenser is made smaller and refrigerant circulating volume is thereby adjusted.

For example, although the temperature of the liquid refrigerant can be lowered by tightening the expansion valve, if the expansion valve is excessively tightened, flushing is caused by the pressure rise of the high-temperature/high-pressure gas to be discharged from the compressor and liquid-pressure drop on the secondary side of the expansion valve. Under these circumstances, the performance of the air conditioner, more specifically, the cooling capability thereof is deteriorated.

The present invention has been contrived in light of the aforementioned circumstances, and an embodiment described herein aims to provide an air conditioner capable of acquiring the cooling effect of electrical components by means of a refrigerant-cooled heat sink while suppressing deterioration in the cooling capability thereof.

DETAILED DESCRIPTION

An embodiment of the present invention will be described below with reference to the accompanying drawings.

In general, according to one embodiment, an outdoor unit of an air conditioner according to one embodiment includes a compressor which discharges a refrigerant into a flow path, a heat exchanger, an expansion valve, a blower fan, electrical components which control the compressor and the blower fan, and a heat sink which cools the electrical components by the refrigerant. The heat exchanger is formed in such a manner that a plurality of heat exchangers are connected in parallel with each other, and includes a heat exchanger of a first group constituted of at least one of the plurality of heat exchangers and a heat exchanger of a second group constituted of at least one of the plurality of heat exchangers not belonging to the first group. The expansion valve includes a first expansion valve which adjusts a degree of supercooling of the heat exchanger of the first group and a second expansion valve which adjusts a degree of supercooling of the heat exchanger of the second group. The heat sink is arranged on the flow path of the refrigerant on the upstream side of a confluence position of the refrigerant branches condensed by the heat exchangers of the first group and the second group and on the downstream side of the second expansion valve.

Figure 1:
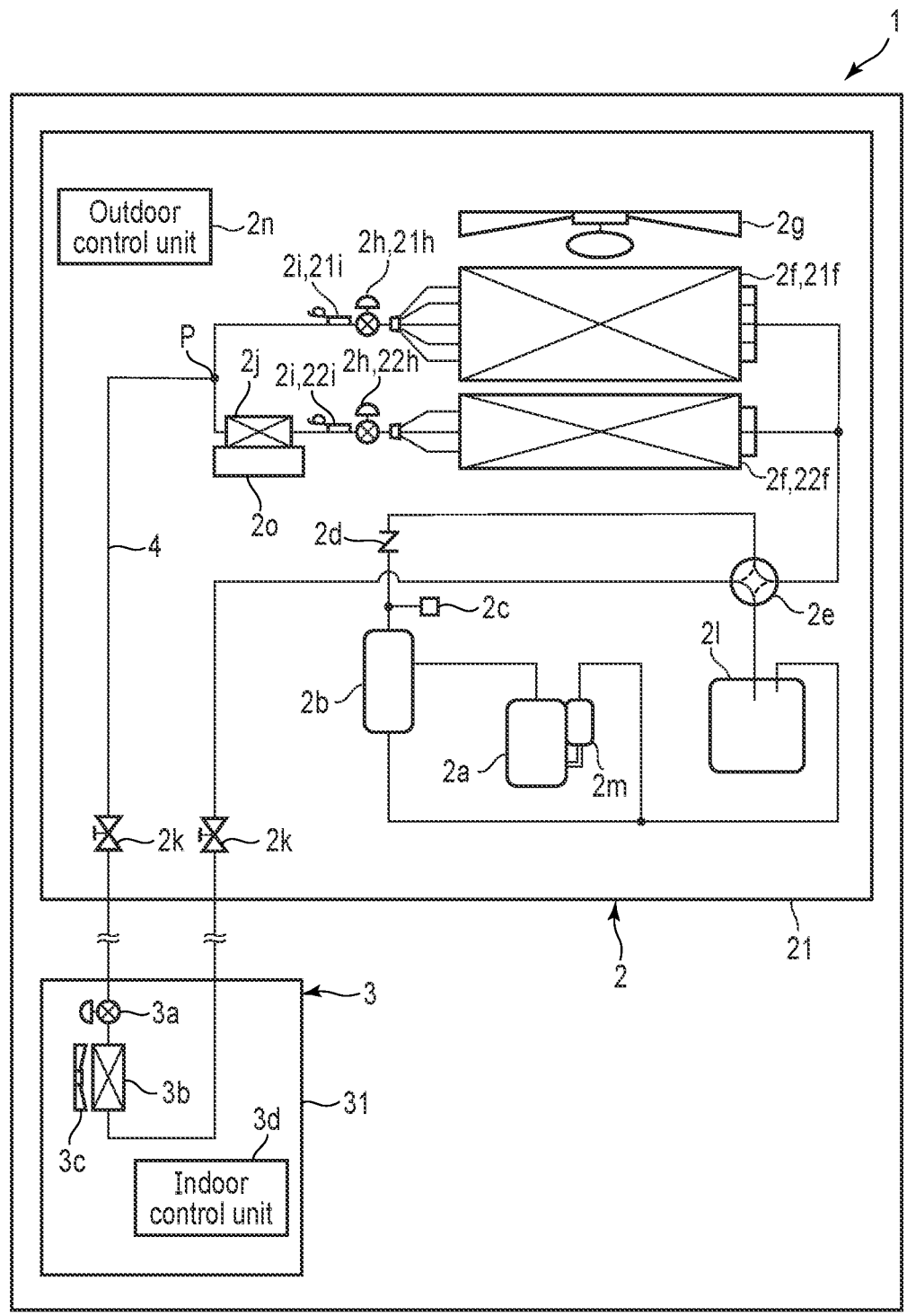
FIG. 1 is a circuit diagram schematically showing the configuration of an air conditioner according to an embodiment.

FIG. 1 is a circuit diagram schematically showing the configuration of an air conditioner 1 according to this embodiment.

As shown in FIG. 1, the air conditioner 1 includes an outdoor unit 2 and indoor unit 3. The outdoor unit 2 and indoor unit 3 are connected to each other by a flow path 4 through which a refrigerant is circulated between both the units 2 and 3. For example, the outdoor unit 2 is installed on a roof of a building and indoor unit 3 is installed in the ceiling space or the like of each floor of the building. However, the installation locations of the units 2 and 3 are not limited to the aforementioned places.

The outdoor unit 2 includes, as main elements, a compressor 2a, oil separator 2b, high-pressure sensor 2c, check valve 2d, four-way valve 2e, heat exchanger(s) (hereinafter referred to as an outdoor heat exchanger) 2f, blower fan (hereinafter referred to as an outdoor fan) 2g, expansion valve(s) (hereinafter referred to as an outdoor expansion valve) 2h, temperature sensor(s) 2i, refrigerant-cooled heat sink (hereinafter referred to as a heat sink) 2j, on-off valve(s) 2k, accumulator 21, and suction cup 2m. The elements other than the outdoor fan 2g are piping-connected to each other inside a housing 21 and are each arranged in or on the flow path 4 connected to the indoor unit 3. The outdoor fan 2g is arranged above the outdoor heat exchanger 2f. The housing 21 defines a contour of the outdoor unit 2. It should be noted that the above-described elements 2a to 2m may not be arranged in one housing 21 and may also be arranged dispersedly in a plurality of housings.

Further, the outdoor unit 2 includes a control unit (hereinafter referred to as an outdoor control unit) 2n and inverter 2o. The outdoor control unit 2n controls operations of the outdoor unit 2 and carries out switching between a cooling operation and heating operation. The inverter 2o rectifies a voltage of a commercial AC source (illustration omitted), frequency-converts the rectified voltage according to an instruction from the outdoor control unit 2n, and outputs the frequency-converted voltage to the compressor 2a and outdoor fan 2g. The inverter 2o includes electrical components configured to control the compressor 2a and outdoor fan 2g as described above. The aforementioned electrical components are, for example, heat-producing components such as switching elements, and circuit board or the like on which the aforementioned elements are mounted, and are refrigerant-cooled by the heat sink 2j.

The indoor unit 3 includes, as main elements, an expansion valve (hereinafter referred to as an indoor expansion valve) 3a, heat exchanger (hereinafter referred to as an indoor heat exchanger) 3b, blower fan (hereinafter referred to as an indoor fan) 3c, and control unit (hereinafter referred to as an indoor control unit) 3d. The indoor expansion valve 3a and indoor heat exchanger 3b are piping-connected to each other inside the housing 31 and are each arranged in the flow path 4 connected to the outdoor unit 2. The indoor fan 3c is arranged in the vicinity of the indoor heat exchanger 3b inside the housing 31. The housing 31 defines a contour of the indoor unit 3. It should be noted that the above-described elements 3a, 3b, and 3c may not be arranged inside one housing 31 and may also be arranged dispersedly in a plurality of housings. The indoor control unit 3d includes, for example, a panel, switches, and buttons all of which are used for operation, display for displaying, and the like and controls a start of operation of the indoor unit 3, mode selection between the cooling operation and heating operation, indoor temperature, and the like. It should be noted that although in FIG. 1, only one indoor unit 3 is shown as an example, a plurality of indoor units 3 may also be provided.

An operation to be carried out in the aforementioned air conditioner 1 at the time of an operation in each of a cooling mode and heating mode will be described below.

For example, when the air conditioner 1 carries out an operation in the cooling mode, the four-way valve 2e is switched in such a manner that the high-temperature/high-pressure gaseous refrigerant compressed by the compressor 2a is discharged into the flow path 4. The discharged gaseous refrigerant is passed through the check valve 2d, is separated from the contained lubricant component by the oil separator 2b and is thereafter guided to the outdoor heat exchanger 2f functioning as a condenser (heat radiator) through the four-way valve 2e.

The gaseous refrigerant guided to the outdoor heat exchanger 2f is condensed by heat exchange with air and is changed into a high-pressure liquid refrigerant. The high-pressure liquid refrigerant is adjusted for the degree of supercooling to be described later by the outdoor expansion valve 2h, is decompressed in the course of passage thereof through the indoor expansion valve 3a, and is thereby changed into a low-pressure liquid refrigerant. The aforementioned liquid refrigerant is guided to the indoor heat exchanger 3b functioning as an evaporator (heat absorber) and, at the same time, carries out heat exchange with air in the course of passage thereof through the indoor heat exchanger 3b.

As a result, the liquid refrigerant takes heat from the air to thereby evaporate and changes into a low-temperature/low-pressure gaseous refrigerant. The air passing through the indoor heat exchanger 3b is cooled by heat exchange with the liquid refrigerant and is blown toward the place to be air-conditioned (cooled) as cool air by the indoor fan 3c.

The low-temperature/low-pressure gaseous refrigerant passing through the indoor heat exchanger 3b is guided to the accumulator 21 through the four-way valve 2e. When a liquid refrigerant fraction which has not fully evaporated is mixed in the refrigerant, the refrigerant is separated here into the liquid refrigerant and gaseous refrigerant. The low-temperature/low pressure gaseous refrigerant separated from the liquid refrigerant is sucked into the compressor 2a from the accumulator 21 and, at the same time, is compressed again by the compressor 2a into a high-temperature/high-pressure gaseous refrigerant to thereby be discharged into the flow path 4.

On the other hand, when the air conditioner 1 carries out an operation in the heating mode, the four-way valve 2e is switched in such a manner that the high-temperature/high-pressure gaseous refrigerant discharged from the compressor 2a is guided to the indoor heat exchanger 3b through the four-way valve 2e and is made to carry out heat exchange with air passing through the indoor heat exchanger 3b. In this case, the indoor heat exchanger 3b functions as a condenser.

As a result, the gaseous refrigerant passing through the indoor heat exchanger 3b is condensed by carrying out heat exchange with the air and is changed into a high-pressure liquid refrigerant. The air passing through the indoor heat exchanger 3b is heated by heat exchange with the gaseous refrigerant and is blown toward the place to be air-conditioned (heated) as a warm current of air by the indoor fan 3c.

The high-temperature liquid refrigerant passing through the indoor heat exchanger 3b is guided to the outdoor expansion valve 2h and, at the same time, is decompressed in the course of passage thereof through the outdoor expansion valve 2h to thereby be changed into a low-pressure liquid refrigerant. The aforementioned liquid refrigerant is guided to the outdoor heat exchanger 2f functioning as an evaporator and, at the same time, is evaporated by carrying out heat exchange here with air to thereby be changed into a low-temperature/low-pressure gaseous refrigerant. The low-temperature/low-pressure gaseous refrigerant passing through the outdoor heat exchanger 2f is sucked into the compressor 2a through the four-way valve 2e and accumulator 21 and, at the same time, is compressed again by the compressor 2a into a high-temperature/high-pressure gaseous refrigerant to thereby be discharged into the flow path 4.

As shown in FIG. 1, the outdoor heat exchanger 2f of the outdoor unit 2 according to this embodiment is constituted of heat exchangers of two groups. Each of the heat exchangers of the two groups is constituted of at least one heat exchanger (outdoor heat exchanger) and the heat exchangers are connected in parallel with each other. More specifically, one (hereinafter referred to as a first group) of the two groups is constituted of at least one outdoor heat exchanger and the other (hereinafter referred to as a second group) is constituted of at least one outdoor heat exchanger not belonging to the first group.

In the example shown in FIG. 1, an outdoor heat exchanger 21f belongs to the first group and outdoor heat exchanger 22f belongs to the second group. That is, in this example, each of the outdoor heat exchangers 2f of the first group and second group is constituted of one outdoor heat exchanger 21f or 22f. However, each of the outdoor heat exchangers 2f of the first group and second group may also be constituted of a plurality of outdoor heat exchangers.

Figure 2:
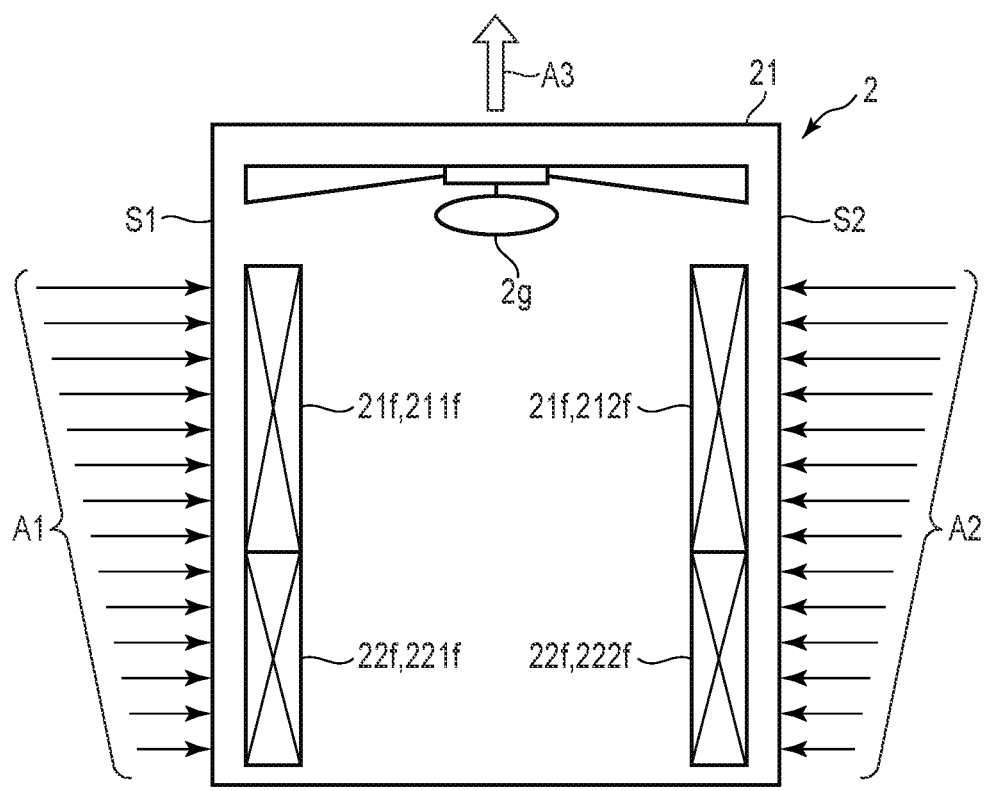
FIG. 2 is a schematic view schematically showing the configuration of an outdoor unit of the air conditioner according to the embodiment from the horizontal direction.

FIG. 2 is a schematic view schematically showing the configuration of the outdoor unit 2 from the horizontal direction. As shown in FIG. 2, the outdoor heat exchangers 21$f$ and 22$f$ are provided at two opposed side surface portions S1 and S2 of the housing 21 of the outdoor unit 2 formed into, for example, approximately a rectangular parallelepiped. For this reason, the outdoor heat exchanger 21$f$ is divided into two constituents (hereinafter referred to as heat exchanger constituents) 211$f$ and 212$f$ respectively adjacent to these two side surface portions S1 and S2 opposed to each other. Likewise, the outdoor heat exchanger 22$f$ is divided into two heat exchanger constituents 221$f$ and 222$f$ respectively adjacent to these two side surface portions S1 and S2 opposed to each other. In the side surface portions S1 and S2, outside-air suction openings (illustration omitted) are formed. When the outdoor fan 2$g$ is driven, the outside air is sucked into the inside of the housing 21 from the suction openings of the side surface portions S1 and S2 through the outdoor heat exchangers 21$f$ and 22$f$ as indicated by arrows A1 and A2 and is discharged to the outside of the housing 21 through the outdoor fan 2$g$ as indicated by an arrow A3.

Inside the housing 21, in sequence from below in the vertical direction (from the bottom face portion in FIG. 2), the outdoor heat exchanger 22$f$ which is the heat exchanger of the second group, outdoor heat exchanger 21$f$ which is the heat exchanger of the first group, and blower fan (outdoor fan) 2$g$ are arranged. That is, the outdoor heat exchanger 21$f$ is arranged closer to the outdoor fan 2$g$ than the outdoor heat exchanger 22$f$. For this reason, as indicated by the arrows A1 and A2 in FIG. 2, when the outdoor fan 2$g$ is driven, the outside air can be sucked into the inside of the housing 21 more easily at the arrangement portion of the outdoor heat exchanger 21$f$ closer to the outdoor fan 2$g$ than at the arrangement portion of the outdoor heat exchanger 22$f$. In other words, the volume and velocity of the wind (air) to be sucked into the inside of the housing 21 are more liable to become greater at the arrangement portion of the outdoor heat exchanger 21$f$ than at the arrangement portion of the outdoor heat exchanger 22$f$. Accordingly, the efficiency of the heat exchange between the refrigerant and outside air (air) can be enhanced more easily at the outdoor heat exchanger 21$f$ on the upper side than at the outdoor heat exchanger 22$f$ on the lower side. For this reason, in each of the examples shown in FIG. 1 and FIG. 2, the upper side outdoor heat exchanger 21$f$ functions as a main heat exchanger and lower side outdoor heat exchanger 22$f$ functions as an auxiliary heat exchanger. It should be noted that it is sufficient if the flow paths of the outdoor heat exchangers 21$f$ and 22$f$ are independent of each other, the flow paths being configured to pass the refrigerant through them, and the flow paths may also be provided in an integrated manner.

In order to make the outdoor heat exchanger 21$f$ function as the main heat exchanger and make outdoor heat exchanger 22$f$ function as the auxiliary heat exchanger, areas and cubic volumes of the heat exchangers 21$f$ and 22$f$ are set as follows in this embodiment. The area of the outdoor heat exchanger 21$f$ is greater than or equal to the area of the outdoor heat exchanger 22$f$. In each of the examples shown in FIG. 1 and FIG. 2, the area of the outdoor heat exchanger 21$f$ is a total of the areas of the two heat exchanger constituents 211$f$ and 212$f$, and this corresponds to the overall area of the heat exchanger of the first group. Likewise, the area of the outdoor heat exchanger 22$f$ is a total of the areas of the two heat exchanger constituents 221$f$ and 222$f$, and this corresponds to the overall area of the heat exchanger of the second group. In addition, the cubic volume of the outdoor heat exchanger 21$f$ is greater than or equal to the cubic volume of the outdoor heat exchanger 22$f$. In each of the examples shown in FIG. 1 and FIG. 2, the cubic volume of the outdoor heat exchanger 21$f$ is a total of the cubic volumes of the two heat exchanger constituents 211$f$ and 212$f$, and this corresponds to the overall cubic volume of the heat exchanger of the first group. Likewise, the cubic volume of the outdoor heat exchanger 22$f$ is a total of the cubic volumes of the two heat exchanger constituents 221$f$ and 222$f$, and this corresponds to the overall cubic volume of the heat exchanger of the second group.

Figure 3A:
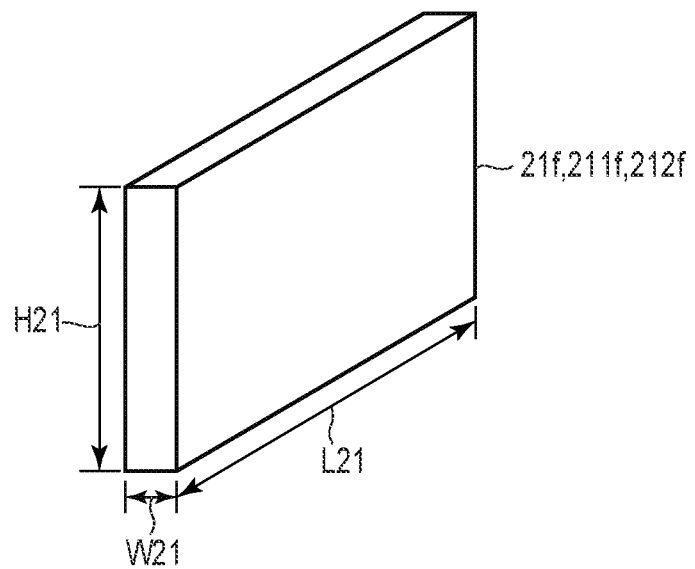
FIG. 3A is a perspective view schematically showing the form of an outdoor heat exchanger of a first group of the outdoor unit shown in FIG. 2.
Figure 3B:
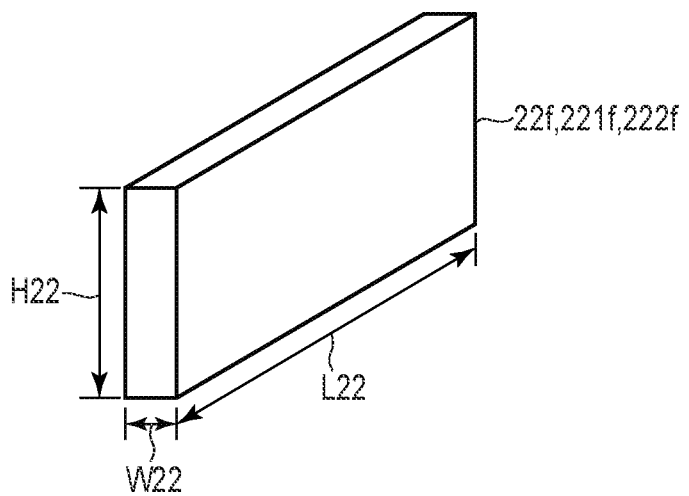
FIG. 3B is a perspective view schematically showing the form of an outdoor heat exchanger of a second group of the outdoor unit shown in FIG. 2.

FIG. 3A is a perspective view schematically showing each of the forms of the heat exchanger constituents 211$f$ and 212$f$ of the outdoor heat exchanger 21$f$ which is the heat exchanger of the first group shown in FIG. 2. FIG. 3B is a perspective view schematically showing each of the forms of the heat exchanger constituents 221$f$ and 222$f$ of the outdoor heat exchanger 22$f$ which is the heat exchanger of the second group shown in FIG. 2. In the example shown in FIG. 3A, the form of each of the heat exchanger constituents 211$f$ and 212$f$ is approximately a rectangular parallelepiped having a height (H21), width (W21), and depth (L21). Accordingly, the area (S21) of the outdoor heat exchanger 21$f$ is approximated by 2×L21×H21, and cubic volume (V21) thereof is approximated by 2×H21×W21×L21. Conversely, in the example shown in FIG. 3B, the form of each of the heat exchanger constituents 221$f$ and 222$f$ is approximately a rectangular parallelepiped having a height (H22), width (W22), and depth (L22). Accordingly, the area (S22) of the outdoor heat exchanger 22$f$ is approximated by 2×L22×H22, and cubic volume (V22) thereof is approximated by 2×H22×W22×L22.

In the examples shown in FIG. 3A and FIG. 3B, the values of the width (W21) and depth (L21) of each of the heat exchanger constituents 211$f$ and 212$f$ are approximately coincident with the values of the width (W22) and depth (L22) of each of the heat exchanger constituents 221$f$ and 222$f$. On the other hand, the value of the height (H21) of each of the heat exchanger constituents 211$f$ and 212$f$ is greater than the value of the height (H22) of each of the heat exchanger constituents 221$f$ and 222$f$. Accordingly, the area (S21) and cubic volume (V21) of the outdoor heat exchanger 21$f$ become greater than the area (S22) and cubic volume (V22) of the outdoor heat exchanger 22$f$ by amounts corresponding to a difference between the heights H21 and H22 (S21>S22, V21>V22).

In order to be correspondent to these outdoor heat exchangers 21$f$ and 22$f$, the outdoor expansion valve 2$h$ includes a first expansion valve 21$h$ and second expansion valve 22$h$. The first expansion valve 21$h$ is arranged in the flow path of the condensed liquid refrigerant passing through the heat exchanger of the first group, i.e., the outdoor heat exchanger 21$f$ in the example shown in FIG. 1. Thereby, for example, when the air conditioner 1 carries out an operation in the cooling mode, the first expansion valve 21$h$ adjusts the degree of supercooling of the liquid refrigerant in the outdoor heat exchanger 21$f$. Conversely, the second expansion valve 22$h$ is arranged in the flow path of the condensed liquid refrigerant passing through the heat exchanger of the second group, i.e., the outdoor heat exchanger 22$f$ in the example shown in FIG. 1. Thereby, for example, when the air conditioner 1 carries out an operation in the cooling mode, the second expansion valve 22$h$ adjusts the degree of supercooling of the liquid refrigerant in the outdoor heat exchanger 22$f$.

Further, the temperature sensor 2$i$ includes a first temperature sensor 21$i$ and second temperature sensor 22$i$. The first temperature sensor 21*i* is arranged on the downstream side of the first expansion valve 21*h* in the flow path of the condensed liquid refrigerant passing through the heat exchanger of the first group, i.e., the outdoor heat exchanger 21*f* in the example shown in FIG. 1. Thereby, for example, when the air conditioner 1 carries out an operation in the cooling mode, the first temperature sensor 21*i* detects the temperature of the liquid refrigerant condensed by the outdoor heat exchanger 21*f* and decompressed by the first expansion valve 21*h*. Conversely, the second temperature sensor 22*i* is arranged on the downstream side of the second expansion valve 22*h* in the flow path of the condensed liquid refrigerant passing through the heat exchanger of the second group, i.e., the outdoor heat exchanger 22*f* in the example shown in FIG. 1. Thereby, for example, when the air conditioner 1 carries out an operation in the cooling mode, the second temperature sensor 22*i* detects the temperature of the liquid refrigerant condensed by the outdoor heat exchanger 22*f* and decompressed by the second expansion valve 22*h*.

The outdoor control unit 2*n* calculates the condensation temperature of the refrigerant from the detected value at the high-pressure sensor 2*c* and calculates the degree of supercooling of the refrigerant from the temperature difference between the aforementioned condensation temperature and detected temperature at the temperature sensor 2*i*. At the time of an operation in the cooling mode, the outdoor control unit 2*n* adjusts the degree of opening of each of the first expansion valve 21*h* and second expansion valve 22*h* according to the calculated degree of supercooling. That is, the outdoor control unit 2*n* calculates the degree of supercooling of the refrigerant in the outdoor heat exchanger 21*f* from the temperature difference between the calculated condensation temperature of the refrigerant and detected temperature at the first temperature sensor 21*i*. Further, the outdoor control unit 2*n* calculates the degree of supercooling of the refrigerant in the outdoor heat exchanger 22*f* from the temperature difference between the calculated condensation temperature of the refrigerant and detected temperature at the second temperature sensor 22*i*.

In this embodiment, the target degree of supercooling of the refrigerant in the outdoor heat exchanger 22*f* is greater than the target degree of supercooling of the refrigerant in the outdoor heat exchanger 21*f*. Accordingly, the outdoor control unit 2*n* controls the degree of opening of each of the first expansion valve 21*h* and second expansion valve 22*h* in such a manner that the degree of supercooling in each of the outdoor heat exchanger 21*f* and outdoor heat exchanger 22*f* becomes the target degree of supercooling of each of the outdoor heat exchanger 21*f* and outdoor heat exchanger 22*f*.

The heat sink 2*j* cools the electrical components which have produced heat, such as the switching elements of the inverter 2*o*, circuit board on which the aforementioned elements are mounted, and the like by means of the refrigerant.

As shown in FIG. 1, the heat sink 2*j* is arranged on the flow path 4 of the refrigerant on the upstream side of the confluence position P of the refrigerant branches condensed by the heat exchangers 21*f* and 22*f* of the first group and second group and on the downstream side of the second expansion valve 22*h*. It should be noted that in the following description, when the outdoor heat exchangers 21*f* and 22*f* function as condensers, the upstream and downstream are defined in relation to the flow direction in which the condensed liquid refrigerant flows through the flow path 4.

For example, when the air conditioner 1 carries out an operation in the cooling mode, the liquid refrigerant passing through the outdoor heat exchanger 22*f* of the second group functioning as a condenser flows into the heat sink 2*j*. Conversely, the liquid refrigerant passing through the outdoor heat exchanger 21*f* of the first group does not flow into the heat sink 2*j*. Accordingly, the degree of cooling of the heat sink 2*j* is controlled by the temperature of the liquid refrigerant condensed by the outdoor heat exchanger 22*f*. From another point of view, the temperature of the liquid refrigerant condensed by the outdoor heat exchanger 21*f* does not contribute to the degree of cooling of the heat sink 2*j*. When higher priority is given to the cooling effect of the heat sink 2*j*, the degree of opening of the second expansion valve 22*h* is controlled by the outdoor control unit 2*n*, whereby the temperature of the liquid refrigerant to be condensed by the outdoor heat exchanger 22*f* is lowered to the temperature of the outside air to be sucked into the inside of the housing 21 by the outdoor fan 2*g*.

It should be noted that the form of the heat sink 2*j* is not particularly limited. For example, the heat sink 2*j* is configured to include a surface portion serving as a surface in contact with the electrical components which are the object of cooling and groove portion serving as a surface in contact with the flow path 4 through which the liquid refrigerant condensed by the outdoor heat exchanger 22*f* is passed. The heat sink 2*j* is formed of one of various types of materials (for example, aluminum, aluminum alloy, and the like) excellent in heat conductivity. The flow path 4 in contact with the heat sink 2*j* is, for example, a copper pipe or the like fitted in the groove portion provided on the heat sink 2*j*.

As described above, according to this embodiment, when the electrical components such as the switching elements of the inverter 2*o*, circuit board on which the aforementioned elements are mounted, and the like are overheated, the degree of supercooling of the outdoor heat exchanger 22*f* functioning as a condenser on the upstream side of the heat sink 2*j* can be controlled by the degree of opening of the second expansion valve 22*h* in such a manner that the cooling effect of the heat sink 2*j* is optimized. On the other hand, the degree of supercooling of the outdoor heat exchanger 21*f* not contributing to the degree of cooling of the heat sink 2*j* can be controlled by the degree of opening of first expansion valve 21*h* in such a manner that the air-conditioning performance of the air conditioner 1 such as the cooling capability is optimized. Thereby, it is possible to suppress a rise in temperature of the electrical components while suppressing a deterioration in the air-conditioning performance of the air conditioner 1 such as a deterioration in the cooling capability.

Further, the area (S21) of the outdoor heat exchanger 21*f* is greater than or equal to the area (S22) of the outdoor heat exchanger 22*f* and the cubic volume (V21) of the outdoor heat exchanger 21*f* is greater than or equal to the cubic volume (V22) of the outdoor heat exchanger 22*f*. For this reason, even when the degree of supercooling of the outdoor heat exchanger 22*f* is controlled by the second expansion valve 22*h* in such a manner that the cooling effect of the heat sink 2*j* is optimized, it is possible to efficiently control the degree of supercooling of the outdoor heat exchanger 21*f* by the first expansion valve 21*h* in such a manner that the air-conditioning performance of the air conditioner 1 is optimized. Accordingly, it is possible to suppress a rise in temperature of the electrical components while efficiently suppressing a deterioration in the air-conditioning performance of the air conditioner 1.

In addition, the target degree of supercooling of the refrigerant in the outdoor heat exchanger 22*f* is greater than the target degree of supercooling of the refrigerant in the outdoor heat exchanger 21*f*. For this reason, even when control is carried out by using the first expansion valve 21*h* in such a manner that the air-conditioning performance of the air conditioner 1 is optimized, it is possible to efficiently control the degree of supercooling of the outdoor heat exchanger 22*f* by the second expansion valve 22*h* in such a manner that the cooling effect of the heat sink 2*j* is optimized. Accordingly, it is possible to efficiently suppress a rise in temperature of the electrical components while suppressing a deterioration in the air-conditioning performance of the air conditioner 1.

That is, according to the outdoor unit 2 of this embodiment, it is possible to realize an air conditioner 1 capable of acquiring the cooling effect of the heat sink 2*j* while suppressing a deterioration in the air-conditioning performance such as the cooling capability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An outdoor unit of an air conditioner comprising: a compressor which discharges a refrigerant into a flow path; a four-way valve; a heat exchanger; an expansion valve; a blower fan; electrical components which control the compressor and the blower fan; and a heat sink which cools the electrical components by the refrigerant, wherein the heat exchanger is formed in such a manner that a plurality of heat exchangers are connected in parallel with each other, and includes a heat exchanger of a first group constituted of at least one of the plurality of heat exchangers and a heat exchanger of a second group constituted of at least one of the plurality of heat exchangers not belonging to the first group, the expansion valve includes a first expansion valve which adjusts a degree of supercooling of the heat exchanger of the first group and a second expansion valve which adjusts a degree of supercooling of the heat exchanger of the second group, and when the second group of heat exchangers functions as a condenser, the heat sink is arranged on the flow path of the refrigerant on the upstream side of a confluence position of the refrigerant condensed by the heat exchangers of the first group and the second group and on the downstream side of the second expansion valve, when the second group of heat exchangers functions as an evaporator, the heat sink is arranged on the flow path of the refrigerant on the downstream side of the confluence position and on the upstream side of the second expansion valve.

2. The outdoor unit of an air conditioner of claim 1, wherein an overall area of the heat exchanger of the first group is greater than or equal to an overall area of the heat exchanger of the second group, and an overall cubic volume of the heat exchanger of the first group is greater than or equal to an overall cubic volume of the heat exchanger of the second group.

3. The outdoor unit of an air conditioner of claim 2, wherein a target degree of supercooling of the refrigerant in the heat exchanger of the second group is greater than a target degree of supercooling of the refrigerant in the heat exchanger of the first group.

4. The outdoor unit of an air conditioner of claim 3, wherein in sequence from below in a vertical direction, the heat exchanger of the second group, the heat exchanger of the first group, and the blower fan are arranged in the order mentioned.

5. The outdoor unit of an air conditioner of claim 2, wherein in sequence from below in a vertical direction, the heat exchanger of the second group, the heat exchanger of the first group, and the blower fan are arranged in the order mentioned.

6. The outdoor unit of an air conditioner of claim 1, wherein in sequence from below in a vertical direction, the heat exchanger of the second group, the heat exchanger of the first group, and the blower fan are arranged in the order mentioned.

* * * * *